United States Patent
Won et al.

(10) Patent No.: US 7,892,966 B2
(45) Date of Patent: Feb. 22, 2011

(54) SEMICONDUCTOR DEVICE HAVING THERMALLY FORMED AIR GAP IN WIRING LAYER AND METHOD OF FABRICATING SAME

(75) Inventors: Seok-jun Won, Gwanak-gu (KR); Andrew-tae Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 227 days.

(21) Appl. No.: 11/859,822

(22) Filed: Sep. 24, 2007

(65) Prior Publication Data

US 2008/0179753 A1   Jul. 31, 2008

(30) Foreign Application Priority Data

Jan. 25, 2007   (KR) .................... 10-2007-0007919

(51) Int. Cl.
*H01L 21/4763* (2006.01)
(52) U.S. Cl. ................. 438/637; 257/E21.575
(58) Field of Classification Search ........... 438/637; 257/E21.575
See application file for complete search history.

(56) References Cited

U.S. PATENT DOCUMENTS

| | | | |
|---|---|---|---|
| 6,690,081 B2 * | 2/2004 | Bakir et al. ................. | 257/522 |
| 7,022,582 B2 * | 4/2006 | Sezi ........................... | 438/422 |
| 7,056,822 B1 * | 6/2006 | Zhao ........................... | 438/619 |
| 7,084,479 B2 | 8/2006 | Chen et al. | |
| 7,112,542 B2 * | 9/2006 | Juengling et al. ........... | 438/782 |
| 7,531,444 B2 * | 5/2009 | Dimitrakopoulos et al. . | 438/619 |
| 2004/0137728 A1 | 7/2004 | Gallagher et al. | |
| 2005/0074961 A1 * | 4/2005 | Beyer et al. ................. | 438/619 |
| 2006/0177990 A1 * | 8/2006 | Beyer et al. ................. | 438/421 |
| 2006/0183315 A1 * | 8/2006 | Dimitrakopoulos et al. . | 438/619 |

FOREIGN PATENT DOCUMENTS

| KR | 1020050054076 A | 6/2005 |
|---|---|---|
| KR | 1020060014425 A | 2/2006 |

\* cited by examiner

*Primary Examiner*—Charles D Garber
*Assistant Examiner*—Stanetta D Isaac
(74) *Attorney, Agent, or Firm*—Volentine & Whitt, PLLC

(57) ABSTRACT

A semiconductor device is provided. A unit wiring level of the semiconductor device includes; first and second wiring layers spaced apart from each other on a support layer, a large space formed adjacent to the first wiring layer and including a first air gap of predetermined width as measured from a sidewall of the first wiring layer, and a portion of a thermally degradable material layer formed on the support layer, small space formed between the first and second wiring layers, wherein the small space is smaller than the large space, and a second air gap at least partially fills the small space, and a porous insulating layer formed on the first and second air gaps.

20 Claims, 7 Drawing Sheets

| | Si | SiO$_2$ | Al | Pt | Ti | Cu |
|---|---|---|---|---|---|---|
| p(g/cm³) | 2.33 | 2.27 | 2.699 | 21.45 | 4.507 | 8.933 |
| c(J/g·°C) | 0.7 | 1.0 | 0.215 | 0.0314 | 0.124 | 0.385 |
| R @0.15μm | 0.5 | 0.1 | 0.9 | – | – | 0.9 |
| α @0.15μm | ~10$^6$ | 1 OR LESS | ~10$^6$ | – | – | ~10$^6$ |

FIG. 15

| EXCIMER LASER | WAVELENGTH (nm) | PHOTON ENERGY (eV) |
|---|---|---|
| NeF* | 108 | 11.48 |
| $Ar_2^*$ | 126 | 9.84 |
| $Kr_2^*$ | 146 | 8.49 |
| $F_2^*$ | 158 | 7.85 |
| ArBr* | 165 | 7.52 |
| $Xe_2^*$ | 172 | 7.21 |
| ArCl* | 175 | 7.08 |
| KrI* | 190 | 6.49 |
| ArF* | 193 | 6.42 |
| KrBr* | 207 | 5.99 |
| KrCl* | 222 | 5.58 |
| KrF* | 248 | 5.01 |
| XeI* | 253 | 4.91 |
| $Cl_2^*$ | 259 | 4.79 |
| XeBr* | 283 | 4.41 |
| $Br_2^*$ | 289 | 4.29 |
| XeCl* | 308 | 4.03 |
| $I_2^*$ | 342 | 3.63 |
| XeF* | 351 | 3.53 |

SEMICONDUCTOR DEVICE HAVING THERMALLY FORMED AIR GAP IN WIRING LAYER AND METHOD OF FABRICATING SAME

CROSS-REFERENCE TO RELATED PATENT APPLICATION

This application claims the benefit of Korean Patent Application No. 10-2007-0007919 filed Jan. 25, 2007, the subject matter of which is hereby incorporated by reference.

BACKGROUND OF THE INVENTION

1. Field of the Invention

The present invention relates to a semiconductor device and a method of fabricating same. More particularly, the invention relates to a semiconductor device having an air gap and a method of fabricating same.

2. Description of the Related Art

As semiconductor devices have become more highly integrated, the spacing between wires and wiring layers has become minute. An insulating layer is used to separate wiring layers. However, an insulating layer having a high dielectric constant tends to increase the capacitance between the wiring layers and may cause signal line delays, thereby decreasing the operating speed of the constituent semiconductor device.

In order to decrease the capacitance between wiring layers, various technologies have been proposed which use an air gap to insulate (or partially insulate) wiring layers with a relatively low dielectric constant. In one such approach, portions of an insulating layer proximate the sidewalls of a via hole are damaged, and the damaged insulating layers are thereafter removed to form air gaps. However, using this approach, the proportion of the air gaps is very low in the overall semiconductor device. Alternatively, an insulating layer is formed from a polymer material which is then thermally degraded to form an air gap. However, this approach may cause other material layers within the semiconductor device to collapse, thereby decreasing the structural stability of the device.

SUMMARY OF THE INVENTION

Embodiments of the invention provide a semiconductor device having air gaps adjoining sidewalls of a wiring layer and yet possessing sufficient structural stability. Embodiments of the invention also provide a method of fabricating a semiconductor device having air gaps.

In one embodiment, the invention provides a semiconductor device comprising a unit wiring level, the unit wiring level comprising; first and second wiring layers spaced apart from each other on a support layer, a large space formed adjacent to the first wiring layer and including a first air gap of predetermined width as measured from a sidewall of the first wiring layer, and a portion of a thermally degradable material layer formed on the support layer, small space formed between the first and second wiring layers, wherein the small space is smaller than the large space, and a second air gap at least partially fills the small space, and a porous insulating layer formed on the first and second air gaps.

In another embodiment, the invention provides a method of fabricating a unit wiring level in a semiconductor device, the method comprising; forming first and second wiring layers separated by a small space on a support layer, wherein a large space is defined to one side of the first wiring layer, filling the small and large spaces with portions of a thermally degradable material layer, forming a porous insulating layer on the thermally degradable material layer, heating portions of the thermally degradable material layer by applying light radiation to the first and second wiring layers, such that a first air gap is formed in the large space and a second air gap is formed in the small space.

BRIEF DESCRIPTION OF THE DRAWINGS

FIG. 15 is a table describing examples of a light source of FIG. 14.

DESCRIPTION OF EMBODIMENTS

The present invention will now be described in some additional detail with reference to the accompanying drawings. The invention may, however, be embodied in many different forms, and should not be construed as being limited to only the illustrated embodiments. Rather, these embodiments are presented as teaching examples. Throughout the drawings, the dimensions of various layers and regions may be exaggerated for clarity of illustration.

A unit wiring level of a semiconductor device according to one embodiment of the invention includes air gaps adjoining sidewalls of wiring layers, a large space between wiring layers includes a first air gap corresponding to a predetermined distance from a sidewall of the wiring layers, and a thermally degradable material layer formed on a support layer. A small space between the wiring layers includes a second air gap adjoining a sidewall of the wiring layers. Accordingly, a semiconductor device designed and fabricated in accordance with the embodiment of the invention has good structural stability because the proportion of air gaps increases yet other material layers do not collapse.

Figure 5:
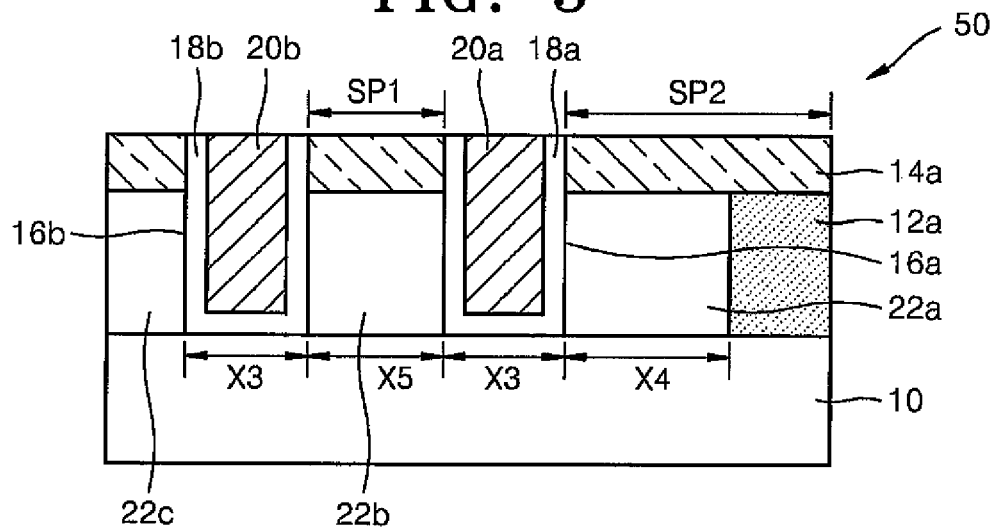
Figure 11:
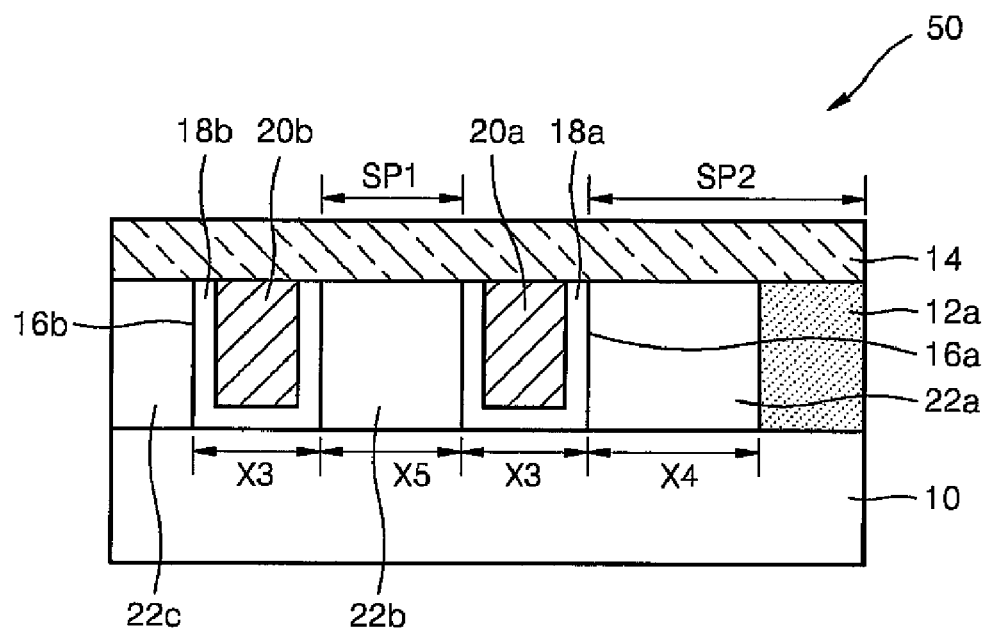

One example of a semiconductor device fabricated in accordance with an embodiment of the invention will be described with reference to FIGS. 5 and 11. FIGS. 5 and 11 illustrate only a single unit wiring level 50 for a constituent semiconductor device formed on a support layer 10 (e.g., a substrate). It is understood that one or more additional unit wiring levels (not shown) may be stacked on unit wiring level 50 of FIGS. 5 and 11.

Figure 6:
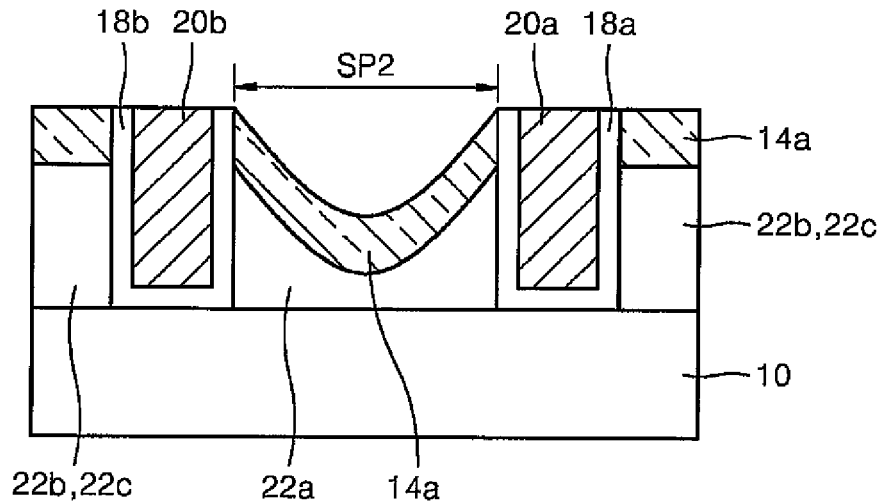
FIG. 6 is a sectional view provided for comparative purposes with the embodiment shown in FIG. 5.

FIG. 5 is a sectional view of a semiconductor device having an air gap according to an embodiment of the invention, and FIG. 6 is a sectional view provided for comparative purposes. FIG. 11 is a sectional view of a semiconductor device having an air gap according to another embodiment of the invention. Throughout the drawings and the accompanying written description, like reference numerals denote like or similar elements.

Referring to FIGS. 5 and 11, the semiconductor device includes first and second wiring layers 20a and 20b formed respectively inside first and second holes 16a and 16b selectively exposing portions of support layer 10. In one embodiment, support layer 10 is a silicon substrate. First and second holes 16a and 16b may be trenches or contact holes formed through unit wiring level 50. When one or more additional unit wiring levels are formed on unit wiring level 50, similar first and second holes 16a and 16b may serve via holes for connecting the stacked wiring layers. First and second wiring layers 20a and 20b may serve as wiring signal lines, and may be used to interconnect layers or other wiring layers, etc.

First wiring layer 20a and second wiring layer 20b are spaced apart from each other. In FIGS. 5 and 11, a plurality of wiring layers may be formed on support layer 10, but only two wiring layers are illustrated for the sake of clarity. A small space SP1 having a relatively small width exists between wiring layers 20a and 20b, and a large space SP2 having a relatively large width exists between wiring layer 20b and another adjacent element (e.g., another wiring layer). That is, another wiring layer may be formed to the right of first wiring layer 20a, but this element has been omitted from the drawing for the sake of clarity.

First and second wiring layers 20a and 20b may be formed (e.g.,) from copper, aluminum, a copper alloy, or an aluminum alloy. First and second barrier metal layers 18a and 18b may be formed respectively on inner walls of first and second holes 16a and 16b. First and second barrier metal layers 18a and 18b may be formed at least one material, such as Ti, TiN, Ta, TaN or an alloy thereof.

The width of first barrier metal layer 18a and first wiring layer 20a is indicated by reference X3, as is the width of second barrier metal layer 18b and second wiring layer 20b. However, the width of first barrier metal layer 18a and first wiring layer 20a may be different from the width of second barrier metal layer 18b and second wiring layer 20b. First and second barrier metal layers 18a and 18b may be formed as needed, and may be included in constituent wiring layer(s) generally. Therefore, the term 'wiring layer' may subsume the possible use of one or more barrier metal layers 18a and 18b hereinafter.

First through third air gaps 22a, 22b and 22c having a dielectric constant of approximately 1 in the illustrated example, may be formed on the sidewalls of first and second wiring layers 20a and 20b. Space SP2 having a large width in relation to first wiring layer 20a includes first air gap 22a indicated by reference X4. First air gap 22a may be obtained on the sidewall of first wiring layer 20a by thermally degrading a portion of material layer 12a formed on support layer 10.

In this context, thermally degradable material layer 12a may be completely removed from the area subsequently occupied by first air gap 22a. However, when the proportion of air gaps is relatively high in a semiconductor device according to an embodiment of the invention, thermally degradable material layer 12a may be only partially removed proximate first wiring layer 20a and may otherwise be allowed to remain adjacent to first air gap 22a. In one embodiment, thermally degradable material layer 12a is formed from a material layer that degrades with application of heat.

Space SP1 between first and second wiring layers 20a and 20b includes second air gap 22b adjoining to the sidewall of second wiring layer 20b. Second air gap 22b may be formed by a complete removal of thermally degradable material layer 12a or a portion of thermally degradable material layer 12a may be allowed to remain within second air gap 22b when the proportion of air gaps is high. That is, second air gap 22b may entirely or partially fill the region between the sidewalls of wiring layers 20a and 20b. Second air gap 22b may be formed to a height equal to the height of thermally degradable material layer 12a. Third air gap 22c may be similarly formed on the sidewall of second wiring layer 20b.

In the illustrated example, width X4 of first air gap 22a may be easily adjusted, and may be equal to or different from width X5 of second air gap 22b. In particular, width X4 of first air gap 22a may be larger than width X5 of second air gap 22b, provided that a porous insulating layer 14a formed on first air gap 22a does not collapse.

In FIG. 5, porous insulating layer 14a is formed with a uniform thickness on the first through third air gaps 22a, 22b and 22c and thermally degradable material layer 12a around first and second wiring layers 20a and 20b. In FIG. 11, a porous insulating layer 14 is formed on first through third air gaps 22a, 22b and 22c, thermally degradable material layer 12a, and first and second wiring layers 20a and 20b. Pores through porous insulating layers 14 and 14a allow gas molecules from thermally degradable material layer 12a to be exhausted. Porous insulating layer 14a and 14 will be described in some additional detail hereafter.

Since a semiconductor device formed in accordance with an embodiment of the invention includes first through third air gaps 22a, 22b and 22c, the overall proportion of air gaps within the semiconductor device is increased to reduced capacitance and avoid any corresponding signal delay. Also, in large space SP2 of the semiconductor device, when thermally degradable material layer 12a is formed including first air gap 22a between the wiring layers, for example, at the sidewalls of first wiring layer 20a, porous insulating layers 14 and 14a will not collapse, but will form the structurally stable first air gap 22a. Also in FIG. 11, porous insulating layer 14 is additionally formed on first and second wiring layers 20a and 20b, thereby aiding in the prevention of porous insulating layer 14 structurally collapsing.

However, in the comparative example of FIG. 6, since thermally degradable material layer 12a is not allowed to partially remain in large space SP2, porous insulating layer 14a collapses.

Next, a method of fabricating a semiconductor device having air gaps according to an embodiment of the invention will be described with reference to FIGS. 1 through 5. In particular, FIGS. 1 through 5 illustrate a method of fabricating unit wiring level 50 for a semiconductor device formed on support layer 10.

Figure 1:
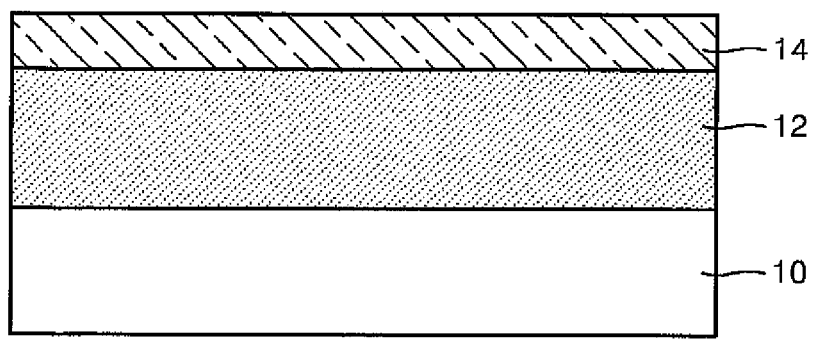
FIGS. 1 through 5 are related sectional views illustrating a semiconductor device having an air gap and a method of fabricating same according to an embodiment of the invention.

Referring to FIG. 1, thermally degradable material layer 12 and porous insulating layer 14 are sequentially formed on support layer 10. Thermally degradable material layer 12 may be formed from a polymer material that is degraded (e.g., converted to gaseous form and exhausted) by application of heat. One or more of the following polymers (as selected examples) or a compound including one or more of the following polymers may be used to form degradable material layer 12; Poly(Ethylene Terephthalate) (PET), Polyamide-6,6 (Nylon 6/6), Syndiotactic Polystyrene (PS-syn), Poly(e-caprolactone), Poly Propylene Oxide (PPO), Polycarbonates, Poly Phenylene Sulfide (PPS), Polyamideimide (PAI), Polyphthalamide (PPA), Poly(a-methylstyrene) (PMS), Poly (ether ether ketone) (PEEK), Polyether sulfone (PES), Poly (ether ketone) (PEK), Linear Polybutadiene, Branched Polyethylene, Linear Poly(p-phenylene), Branched Poly(p-xylene), Polyacryolonitrile (PAN), and Polystyrene (PS).

Porous insulating layer 14 may be formed from a material having a relatively low dielectric constant, such as a silicon oxide layer including carbon (SiOC) or a hydrogenated version of same (SiOC:H).

Figure 2:
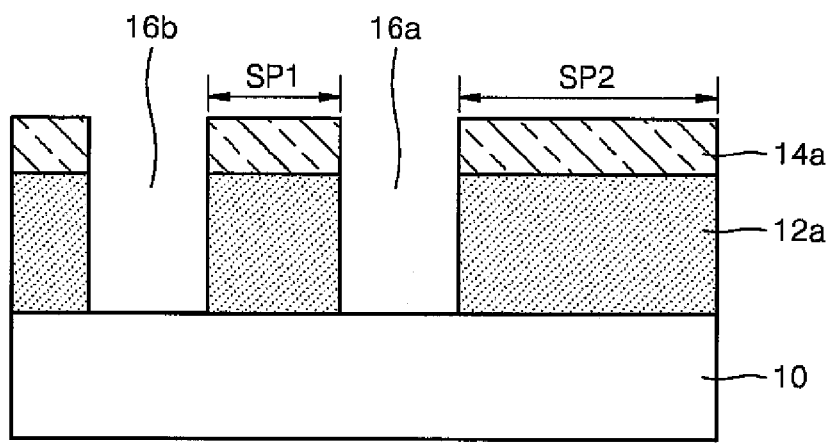

Referring to FIG. 2, porous insulating layer 14 and thermally degradable material layer 12 are selectively etched to form first and second holes 16a and 16b. As first and second holes 16a and 16b are formed, porous insulating layer 14 and thermally degradable material layer 12 respectively become a patterned porous insulating layer 14a and a patterned thermally degradable material layer 12a. Patterned porous insulating layer 14a and patterned thermally degradable material layer 12a are defined in part by space SP1 and space SP2.

Figure 3:
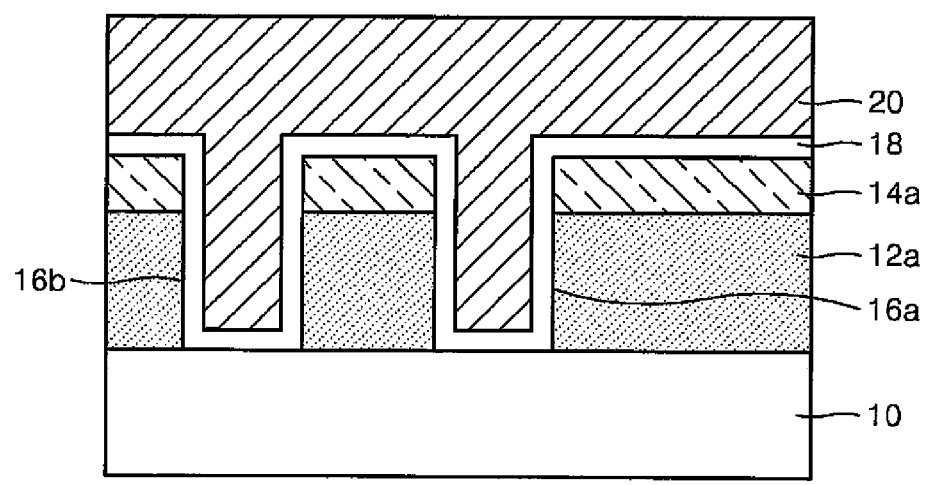

Referring to FIG. 3, barrier metal layer 18 is formed on support layer 10 including first and second holes 16a and 16b. Barrier metal layer 18 is formed on the inner walls of first and second holes 16a and 16b, the exposed surface of support layer 10, and patterned porous insulating layer 14a. Next, metal layer 20 is formed on barrier metal layer 18 so as to fill first and second holes 16a and 16b.

Figure 4:
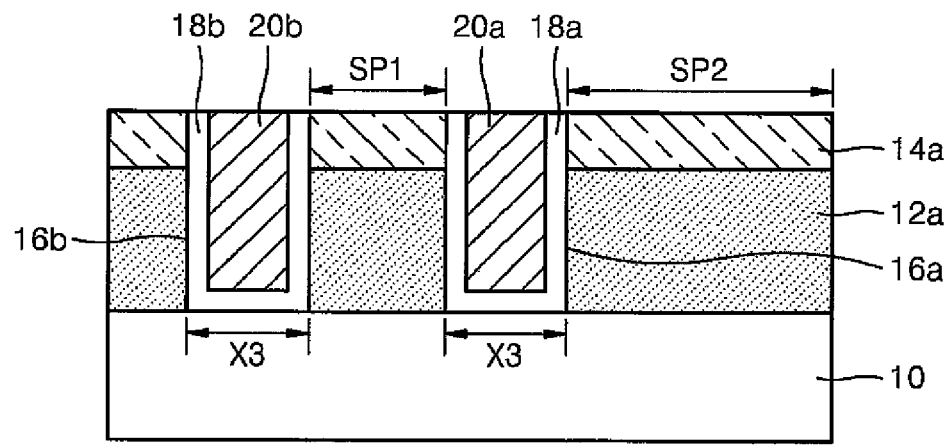

Referring to FIG. 4, metal layer 20 is planarized using patterned porous insulating layer 14a as an etch stop layer. Metal layer 20 may be planarized using a conventional chemical mechanical polishing (CMP) process. Thereafter, a first barrier metal layer 18a and a first wiring layer 20a are formed in first hole 16a, and a second barrier metal layer 18b and a second wiring layer 20b are formed in second hole 16b. Small space SP1 is formed between the first and second wiring layers 20a and 20b and large space SP2 is formed to the side of first wiring layer 20a.

Referring to FIG. 5, portions of thermally degradable material layer 12 adjacent to the sidewalls of first and second wiring layers 20a and 20b are removed to form first through third air gaps 22a, 22b and 22c and to form a patterned thermally degradable material layer 12a which partially remains in at least first air gap 22a. That is, first air gap 22a is formed with a width X4 measured from the sidewall of first wiring layer 20a.

Accordingly, first air gap 22a is partially formed in large space SP2, second air gap 22b is formed in small space SP1, and third air gap 22c is formed at the sidewall of second wiring layer 20b. Third air gap 22c may be included in either a small or large space.

First through third air gaps 22a, 22b and 22c are formed in one embodiment by radiating light that is easily absorbed by first and second wiring layers 20a and 20b. The absorption of radiated light generates thermal energy radiated from first and second wiring layers 20a and 20b. When applied in this manner, the thermal energy causes thermal degradation of thermally degradable material layer 12a adjacent to first and second wiring layers 20a and 20b. The gas molecules that result from thermal conversion of thermally degradable material layer 12a are out-gas through patterned porous insulating layer 14a. The pores in the porous insulating layer 14a may be connected with one another in a vertical direction, thus allowing easy exhaust of the gas molecules.

When first and second wiring layers 20a and 20b are heated by exposure to light radiation, first through third air gaps 22a, 22b and 22c are linearly formed by the conducted heat beginning at the heating source, namely first and second wiring layers 20a and 20b. A controlled application of heat through the light radiation of first and second wiring layers 20a and 20b may be facilitated by an additional heating of thermally degradable material layer 12 through support 10. That is, thermally degradable material layer 12 may be heated to a point below its degradation threshold temperature through support 10. Then application of additional heat by light radiation may readily form first through third air gaps 22a, 22b and 22c in a carefully controlled manner. The heating of support layer 10 and the light radiation will be described in some additional detail hereafter.

In the semiconductor device illustrated in FIG. 5, porous insulating layer 14a does not collapse and first air gap 22a is stable, while the proportion of air gaps 22a, 22b and 22c is increased in the aggregate, because thermally degradable material layer 12a is allowed to partially remain in large space SP2. On the other hand, the comparative structure illustrated in FIG. 6 is not stable and porous insulating layer 14a collapses into large space SP2.

One version of unit wiring level 50 for a semiconductor device may be completed by application of the fabrication processes described with reference to FIGS. 1 through 5. Next, a method of fabricating the semiconductor device having air gaps according to another embodiment of the present invention will be described with reference to FIGS. 7 through 11.

Figure 7:
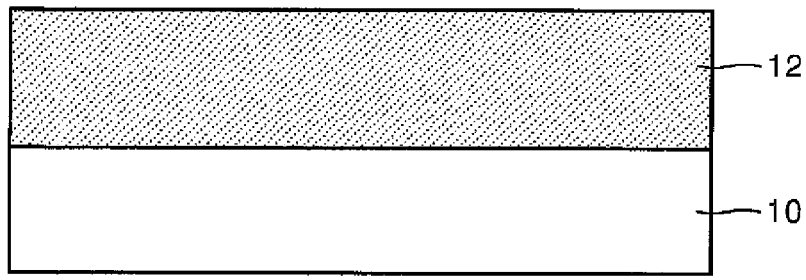
FIGS. 7 through 11 are related sectional views illustrating a semiconductor device having an air gap and a method of fabricating same according to another embodiment of the invention.

Referring to FIG. 7, thermally degradable material layer 12 is again formed on support layer 10.

Figure 8:
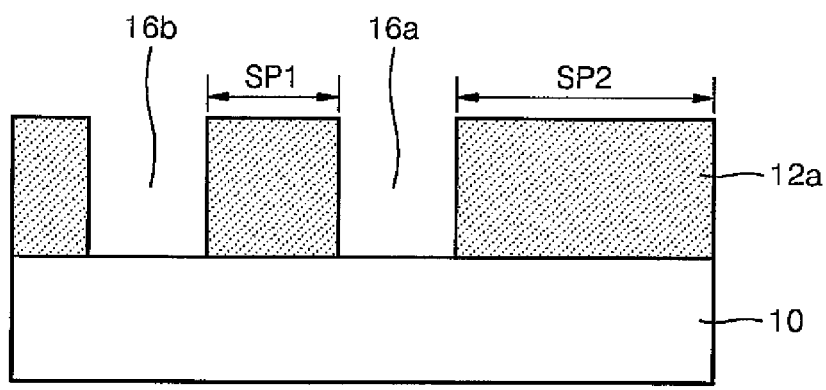

Referring to FIG. 8, thermally degradable material layer 12 is again selectively etched to form first and second holes 16a and 16b. As first and second holes 16a and 16b are formed, thermally degradable material layer 12 becomes patterned thermally degradable material layer 12a.

Figure 9:
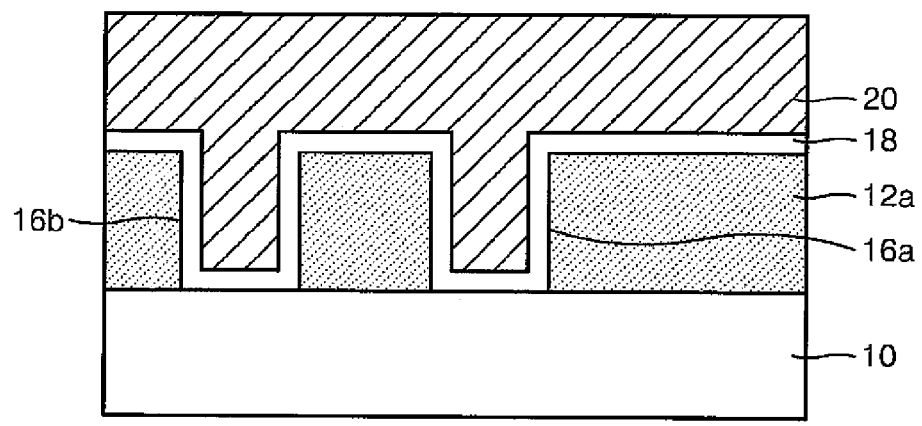
Figure 10:
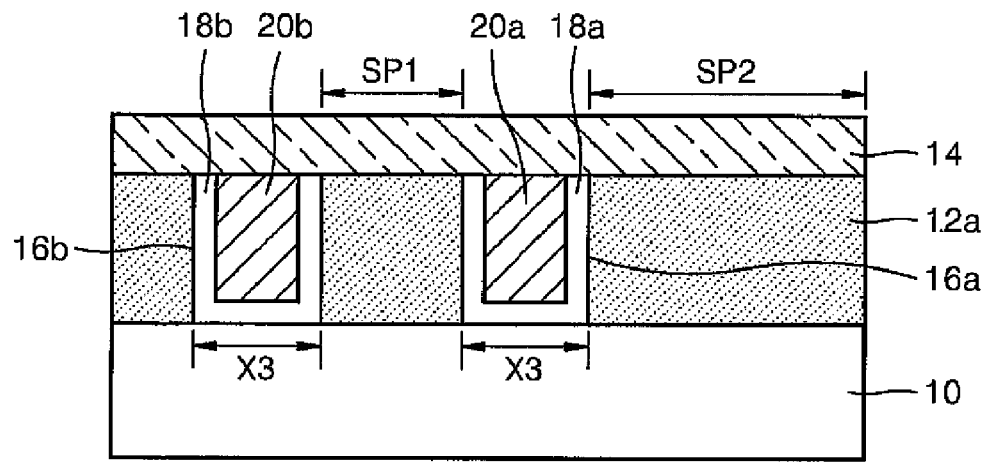

Referring to FIG. 9, barrier metal layer 18 is again formed on the surface of support layer 10 including first and second holes 16a and 16b. Next, metal layer 20 is formed on barrier metal layer 18 to fill first and second holes 16a and 16b.

Referring to FIG. 10, metal layer 20 is again planarized using patterned thermally degradable material layer 12a as an etch stop layer.

Small space SP1 is again formed between first and second wiring layers 20a and 20b and large space SP2 is formed to the side of first wiring layer 20a. Next, porous insulating layer 14 is formed on the entire surface of patterned thermally degradable material layer 12a and wiring layers 20a and 20b. Porous insulating layer 14 may be formed as previously described.

Referring to FIG. 11, portions of thermally degradable material layer 12 adjacent to the sidewalls of first and second wiring layers 20a and 20b are removed to form first through third air gaps 22a, 22b and 22c. Here, patterned thermally degradable material layer 12a remains to partially fill first air gap 22a, such that first air gap 22a has a width X4 measured from the sidewall of first wiring layer 20a.

In FIG. 11, when forming first through third air gaps 22a, 22b and 22c, the thermally degraded material is out-gases as described above through porous insulating layer 14. Unit wiring level 50 of the semiconductor device is now complete on support layer 10.

In the semiconductor device illustrated in FIG. 11, porous insulating layer 14a does not collapse into first air gap 22a in the area of large space SP2, yet the proportion of air gaps 22a, 22b and 22c is increased because the porous insulating layer 14 is formed on wiring layers 20a and 20b, thereby gaining structural support.

One possible approach to heating the thermally degradable material though light radiation of first and second wiring layers 20a and 20b will now be described. This radiative heating process may be expressed by the following equation:

$$\Delta T \propto [\alpha(1-R)]/[\rho C],$$

where $\Delta T$ represents the temperature difference before and after light radiation, $\alpha$ represents the light absorption coefficient of the material layer, R represents the reflectance of the material layer, $\rho$ represents the density of the material layer, and C represents the specific heat of the material layer.

Taking the relationships manifest by this equation into account, the temperature difference before and after the light radiation is influenced more by the light absorption coefficient, the density, and the specific heat than by the reflectance, and in particular, is greatly influenced by the light absorption coefficient.

Figures 12, 13:
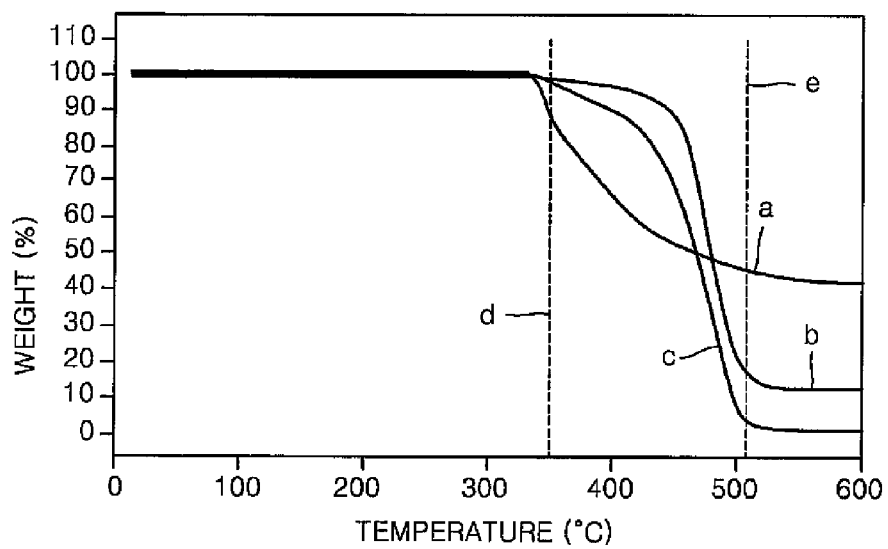
FIG. 12 is a table illustrating the light absorption coefficient, the reflectance, the density, and the specific heat of various material layers.
FIG. 13 is a graph illustrating a thermogravimetric analysis (TGA) of a thermally degradable material layer used for the present invention.

FIG. 12 is a table illustrating the light absorption coefficient, the reflectance, the density, and the specific heat for various material that might be used to form wiring layers 20a and 20b or used in association with wiring layers 20a and 20b, as well as certain comparative materials.

An insulating layer such as a silicon oxide layer has a very low light absorption coefficient of 1 or less, while a metal layer such as an aluminum layer has a very high light absorption coefficient of approximately 106, as illustrated in FIG. 12. According to the foregoing equation, a difference in the light absorption coefficient between the insulating layer and the metal layer is so large that it offsets the effect of the reflectance. Accordingly, the temperature of the metal layer can increase by selectively heating the metal layer rather than by the insulating layer using light radiation.

The wavelength of the light radiation may be determined such that the light is easily absorbed by the metal layer but not by the insulating layer, taking the respective light absorption coefficient into consideration. The wavelength of light can also be determined depending on the temperature difference between the insulating layer and the metal layer. In FIG. 12, the wavelength of the applied light was 0.15 μm. As a result, it has been found that when the wavelength of light is in the range of 1-2 μm or less, for example, 0.5 μm or less, the light absorption coefficient of the insulating layer such as a silicon oxide layer decreases, and that of the metal layer such as an aluminum layer increases. Accordingly, a light wavelength of 1-2 μm or less, and in some embodiments 0.5 μm or less, may be appropriate for the light radiation heating described in relation to FIGS. 4 and 5 and FIGS. 10 and 11 above.

In FIGS. 4 and 5 and FIGS. 10 and 11, first through third air gaps 22a, 22b and 22c may be formed by heating first and second wiring layers 20a and 20b through light radiation. The temperature difference before and after application of the light radiation to first and second wiring layers 20a and 20b is given by the foregoing equation.

Next, the degree of thermal degradation associated with thermally degradable material layer 12 will be described assuming light radiation consistent with the foregoing is applied to first and second wiring layers 20a and 20b.

In FIGS. 4 and 5, FIGS. 10 and 11, when first and second wiring layers 20a and 20b are heated, the heat diffusion period from first and second wiring layers 20a and 20b into thermally degradable material layer 12 should be determined such that a portion of thermally degradable material layer 12a remains in first air gap 22a. In one possible approach, the heat diffusion period may be calculated according to the following equation:

$$\text{heat diffusion length}(\delta) = 2(\chi\tau)^{1/2},$$

where X represents the heat diffusion coefficient of thermally degradable material layer 12, and τ represents the duration of the light pulse locally applied to first and second wiring layers 20a and 20b.

Taking this relationship into consideration, the heat diffusion period from first and second wiring layers 20a and 20b to thermally degradable material layer 12 may be decreased by reducing the light pulse duration. In particular, the heat diffusion period from first wiring layer 20a to thermally degradable material layer 12, associated with the development of width X4 for first air gap 22a, may be decreased by reducing the light pulse duration. For example, a heat diffusion period may be approximately 1 μm when the light pulse duration is one nanosecond, while a heat diffusion period may be approximately 10 nm when the light pulse duration is one femtosecond.

Next, a temperature margin will be described for thermally degradable material layer 12 when it is heated through first and second wiring layers 20a and 20b by light radiation. As noted above in relation to FIGS. 4 and 5 and FIGS. 10 and 11, certain embodiments of the invention require a precise temperature margin in order to prevent complete degradation of thermally degradable material layer 12 within large space SP2 in order to properly form first air gap 22a.

FIG. 13 is a graph illustrating a thermogravimetric analysis (TGA) of a thermally degradable material layer used in one embodiment of the invention.

In FIG. 13, reference numeral (a) represents the weight of polyacrylonitrile (PAN), reference numeral (c) represents the weight of polystyrene (PS), and reference numeral (b) represents the weight of a graft polymer of PAN and PS. FIG. 13 illustrates a portion of thermally degradable material layer 12 used within an embodiment of the invention. Referring to FIG. 13, thermally degradable material layer 12 begins degrading around 350° C. as represented by (d), and is completely degraded at 510° C. as represented by (e). That is, the temperature margin of thermally degradable material layer 12 is approximately 160° C., or the difference between (d) and (e). Therefore, the amount of thermally degradable material layer 12a remaining adjacent to first air gap 22a may be controlled according to this temperature margin determination.

A light radiating apparatus used for heating a thermally degradable material layer on support layer 10 by radiating light according to an embodiment of the invention will be described below.

Figure 14:
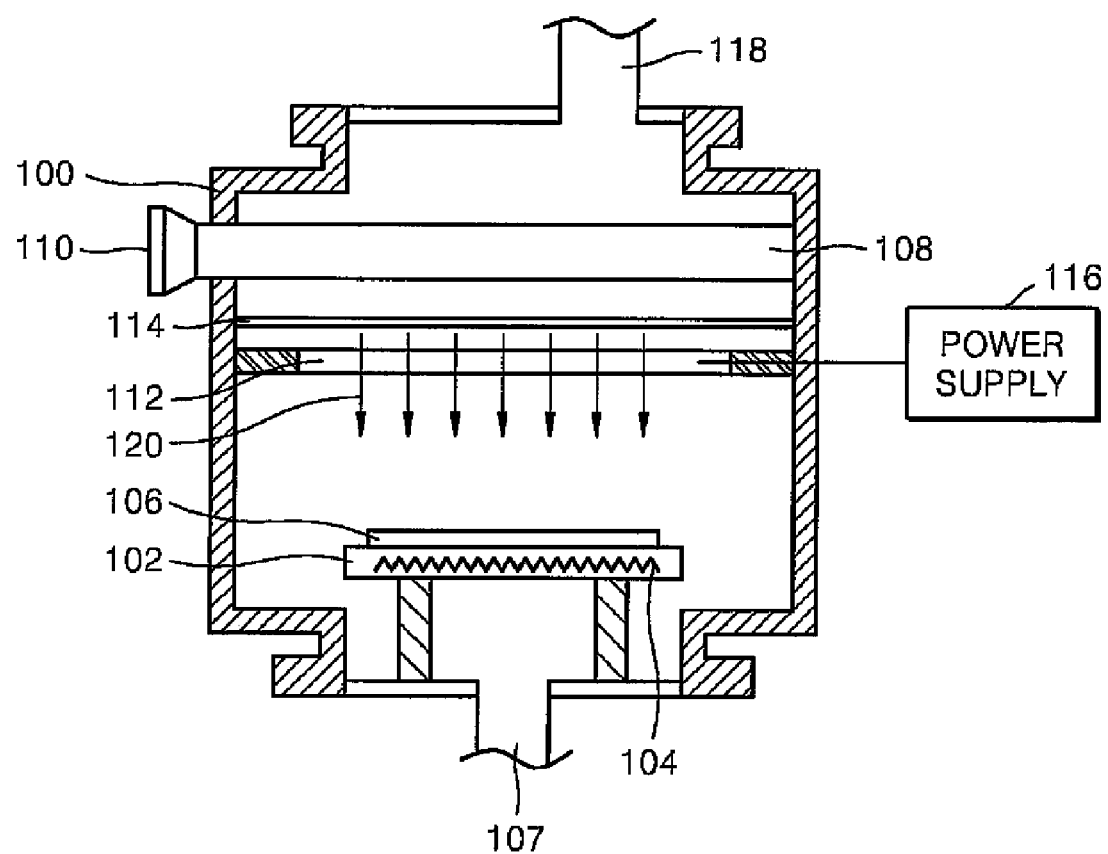
FIG. 14 is a schematic view of a light radiating apparatus used for the present invention.

FIG. 14 is a sectional view of a light radiating apparatus used for the present invention and FIG. 15 is a table describing examples of a light source of FIG. 14.

The light radiating apparatus includes a support member 102 mounting a semiconductor substrate 106 such as a silicon substrate inside an apparatus body 100. A heater 104 is installed for heating the semiconductor substrate 106 inside support member 102. Heater 104 may heat the semiconductor substrate 106 using resistive heating. Heater 104 may be used to heat support layer 10 identified in relation to FIGS. 4 and 5 and FIGS. 10 and 11.

A light source 108 such as a light lamp is positioned over semiconductor substrate 106 for radiating light to heat semiconductor substrate 106. Light source 108 may radiate light at various wavelengths. A view port 110 for observing light generation is formed on side of light source 108. In the illustrated embodiment, an excimer laser may be used. Referring to FIG. 15, the wavelength of the excimer laser may be varied from 108 nm to 351 nm, and the photon energy may be varied from 11.48 eV to 3.53 eV.

A window 112 is formed under light source 108 to transfer light 120 radiated from light source 108 to semiconductor substrate 106. Light 120 may be transferred to semiconductor substrate 106 using light source 108 and window 112. As described above, in FIGS. 4 and 5, first and second wiring layers 20a and 20b may be selectively heat by light radiation using light source 108 and window 112.

The illustrated light radiating apparatus may include a mechanical shutter 114 between light source 108 and window 112, that is, above window 112. Mechanical shutter 114 opens and closes to control radiation of light 120 from light source 108. The duration of the light pulse transferred from light source 108 to semiconductor substrate 106 may be controlled by mechanical shutter 114. In FIGS. 4 and 5 and FIGS. 10 and 11, the heat diffusion period from first and second wiring layers 20a and 20b to thermally degradable material layer 12a may be controlled by controlling the light pulse duration.

In the illustrated light radiating apparatus, power may be applied to window 112 through a power supply 116 to transition window 112 between a transparent state and an opaque state, thereby allowing window 112 to serve as an electrical shutter without the necessity of installing mechanical shutter 114. In such a case, the duration of the light pulse transferred from light source 108 may be controlled by window 112. The illustrated light radiating apparatus may also include connecting parts 107 and 118 formed at upper and lower portions of body 100 for introducing a gas atmosphere. Alternatively, connecting parts 107 and 118 may be connected to a pump (not shown) for creating a vacuum.

In relation to the embodiments described in FIGS. 4 and 5 and FIGS. 10 and 11, when using the illustrated light radiating apparatus, support layer 10 may be heated to a predetermined temperature, for example, approximately 300° C., using heater 104, and then thermally degradable material layer 12 is additionally heated to its degradation temperature using light source 108, window 112, and shutter 114, to thereby remove (or partially remove) thermally degradable material layer 12 to form air gaps 22a, 22b and 22c.

As described above, a semiconductor device of the present invention has air gaps adjacent to sidewalls of wiring layers, and includes a thermally degradable material layer formed on a support layer while including an air gap with a predetermined distance from a sidewall of the wiring layer. Therefore, the semiconductor device of the present invention has a stable structure since the proportion of air gaps increases and other material layers formed on the air gaps do not collapse.

According to a method of fabricating a semiconductor device of the present invention, wiring layers are partially heated through light radiation to thermally degrade a thermally degradable material layer, thereby forming air gaps adjoining sidewalls of the wiring layers. Also, the thermally degradable material layer remains on a support layer such that it is spaced from a sidewall of the wiring layer by an air gap. The width of the air gap formed by thermal degradation of the thermally degradable material layer may be controlled by controlling the light pulse duration when radiating light.

While the present invention has been particularly shown and described with reference to exemplary embodiments thereof, it will be understood by those of ordinary skill in the art that various changes in form and detail may be made therein without departing from the scope of the present invention as defined by the following claims.

What is claimed is:

1. A method of fabricating a unit wiring level in a semiconductor device, the method comprising:
    forming first and second wiring layers separated by a small space on a support layer, wherein a large space is defined to one side of the first wiring layer;
    filling the small and large spaces with portions of a thermally degradable material layer;
    forming a porous insulating layer on the thermally degradable material layer, such that all of the portions of the thermally degradable material are completely covered by corresponding portions of the porous insulating layer;
    heating portions of the thermally degradable material layer proximate the first and second wiring layers using heat energy generated by applying light radiation to the first and second wiring layers to cause thermal degradation of the portions of the thermally degradable material layer and out-gassing of a resulting gas through the porous insulating layer, such that a first air gap is formed in the large space and a second air gap is formed in the small space while the first air gap and second air gap remain completely covered by the corresponding portions of the porous insulating layer.

2. The method of claim 1, wherein the first air gap partially fills the large space, such that a residual portion of the thermally degradable material layer fills a residual portion of the large space following heating of the portions of the thermally degradable material layer.

3. The method of claim 1, wherein the second air gap completely fills the small space.

4. The method of claim 1, wherein forming the first and second wiring layers and filling the small and large spaces with portions of a thermally degradable material layer comprise:
    forming the thermally degradable material layer on the support layer;
    selectively etching the thermally degradable material layer to form a plurality of holes that define the small and large spaces; and
    forming the first and second wiring layers in the holes.

5. The method of claim 4, wherein the holes are at least one of contact holes, trench holes, and via holes.

6. The method of claim 4, wherein the degradation of the thermally degradable material layer proximate the first and second wiring layers and forming the first and second air gaps is caused solely by conductive diffusion of heat energy through the first and second wiring layers into the thermally degradable material layer, wherein the heat energy is generated in the first and second wiring layers by the application of the light radiation.

7. The method of claim 6, wherein a width of the first air gap as measured from a sidewall of the first wiring layer to a sidewall of the second wiring gap is defined by a heat diffusion period during which the heat energy is thermally diffused through the first and second wiring layers into the thermally degradable material layer.

8. The method of claim 7, wherein the heat diffusion period is defined in part by a pulse duration for the light radiation.

9. The method of claim 4, wherein the thermally degradable material layer is completely removed from the large space to the second air gap.

10. A method of fabricating a unit wiring level in a semiconductor, the method comprising:
    forming a thermally degradable material layer on a support layer, and then forming a porous insulating layer to completely cover the thermally degradable material; layer;
    etching the thermally degradable material layer and the porous insulating layer to form a first hole and a second hole, wherein the first hole is separated on one side from the second hole by a large space and is separated on the other side from another hole by a small space having a width less than the width of the large space, and respective portions of the thermally degradable material layer formed by the formation of the first and second holes remain completely covered by corresponding portions of the porous insulating layer;
    forming a first wiring layer in the first hole and forming a second wiring layer in the second hole; and
    applying light radiation to the first and second wiring layers to generate heat energy while completely shielding portions of the thermally degradable material layer from the light radiation using the corresponding portions of the porous insulating layer, wherein the heat energy conductively diffuses from the first and second wiring layers to thermally degrade the thermally degradable material layer and respectively form a first air gap in the large space and a second air gap in the small space.

11. The method of claim 10, wherein the second air gap completely fills the small space and the first air gap only partially fills the large space, such that a residual portion of the thermally degradable material layer remains in the large space.

12. The method of claim 10, wherein the second air gap completely fills the small space and the first air gap completely fills the large space.

13. The method of claim 10, wherein the first and second holes are at least one of first and second contact holes, first and second trench hole, and first and second via holes.

14. The method of claim 13, wherein the heat diffusion period is defined in part by a pulse duration for the light radiation.

15. The method of claim 10 wherein a width of the first air gap as measured from a sidewall of the first wiring layer to a sidewall of the second wiring gap is defined by a heat diffusion period during which the heat energy is thermally diffused from the first and second wiring layers into the thermally degradable material layer.

16. A method of fabricating a unit wiring level in a semiconductor, the method comprising:

forming a thermally degradable material layer on a support layer;

etching the thermally degradable material layer to form a first hole and a second hole, wherein the first hole is separated on one side from the second hole by a large space and is separated on the other side from another hole by a small space having a width less than the width of the large space;

forming a first wiring layer in the first hole and forming a second wiring layer in the second hole;

after forming the first and second wiring layers, forming a porous insulating layer to completely cover the first and second wiring layers and portions of the thermally degradable material formed by formation of the first and second holes;

applying light radiation to the first and second wiring layers to generate heat energy while leaving the porous insulating layer completely intact to shield the portions of the thermally degradable material layer, wherein the heat energy conductively diffuses from the first and second wiring layers to thermally degrade the thermally degradable material layer and respectively form a first air gap in the large space and a second air gap in the small space.

17. The method of claim 16, wherein the second air gap completely fills the small space and the first air gap only partially fills the large space, such that a residual portion of the thermally degradable material layer remains in the large space.

18. The method of claim 16, wherein the second air gap completely fills the small space and the first air gap completely fills the large space.

19. The method of claim 16 wherein a width of the first air gap as measured from a sidewall of the first wiring layer to a sidewall of the second wiring gap is defined by a heat diffusion period during which the heat energy is thermally diffused from the first and second wiring layers into the thermally degradable material layer.

20. The method of claim 19, wherein the heat diffusion period is defined in part by a pulse duration for the light radiation.

* * * * *